(12) United States Patent
Ishihara et al.

(10) Patent No.: US 11,799,315 B2
(45) Date of Patent: Oct. 24, 2023

(54) BATTERY CONTROL APPARATUS FOR POWER SUPPLY SYSTEM

(71) Applicant: HONDA MOTOR CO., LTD., Tokyo (JP)

(72) Inventors: Yuya Ishihara, Wako (JP); Daiko Tsutsumi, Wako (JP); Takeshi Matsumoto, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 17/697,010

(22) Filed: Mar. 17, 2022

(65) Prior Publication Data

US 2022/0311269 A1 Sep. 29, 2022

(30) Foreign Application Priority Data

Mar. 29, 2021 (JP) ................. 2021-054969

(51) Int. Cl.
*H02J 7/34* (2006.01)
*B60L 50/40* (2019.01)
*H02J 7/00* (2006.01)
*B60L 50/60* (2019.01)
*B60L 58/22* (2019.01)
*G01R 31/3835* (2019.01)

(52) U.S. Cl.
CPC ............. *H02J 7/345* (2013.01); *B60L 50/40* (2019.02); *B60L 50/60* (2019.02); *B60L 58/22* (2019.02); *G01R 31/3835* (2019.01); *H02J 7/0013* (2013.01); *H02J 7/0063* (2013.01); *B60L 2240/547* (2013.01)

(58) Field of Classification Search
CPC ........ H02J 7/345; H02J 7/0013; H02J 7/0063; G01R 31/3835; B60L 50/60; B60L 58/22; B60L 50/40; B60L 2240/547
USPC ........................................................ 307/9.1
See application file for complete search history.

(56) References Cited

U.S. PATENT DOCUMENTS

2017/0166065 A1* 6/2017 Hong .................... H02J 7/00
2017/0166075 A1* 6/2017 Hong .................... B60L 50/66

FOREIGN PATENT DOCUMENTS

JP 2018-042342 3/2018

* cited by examiner

*Primary Examiner* — Rexford N Barnie
*Assistant Examiner* — Swarna N Chowdhuri
(74) *Attorney, Agent, or Firm* — AMIN, TUROCY & WATSON, LLP (57) ABSTRACT

Before power is supplied to a load from a capacitor and a plurality of batteries, a battery for initially supplying power for charging to the capacitor is determined from among the plurality of batteries, based on a result of acquiring the voltage of each battery, and voltage equalization of the plurality of batteries is performed in response to power for charging being supplied to the capacitor from the determined battery.

7 Claims, 6 Drawing Sheets

BATTERY CONTROL APPARATUS FOR POWER SUPPLY SYSTEM

CROSS-REFERENCE TO RELATED APPLICATIONS

This application is based upon and claims the benefit of priority from Japanese Patent Application No. 2021-054969 filed on Mar. 29, 2021, the contents of which are incorporated herein by reference.

BACKGROUND OF THE INVENTION

Field of the Invention

The present invention relates to a battery control apparatus for a power supply system that includes a plurality of batteries capable of being connected in parallel. More specifically, the present invention relates to a battery control apparatus that performs voltage equalization for the plurality of batteries in the power supply system.

Description of the Related Art

A heavy-load drive motor, such as a traction motor of an electric automobile or a flight motor of an electric aircraft, is supplied with electric power from a high-power battery formed by connecting high-voltage batteries in parallel.

In a power supply system that supplies power to a load by connecting a plurality of batteries in parallel, an excessive inrush current flows to batteries with a low voltage from batteries with a high voltage when the parallel connection is established. In order to suppress this flow of such an excessive inrush current, the plurality of batteries are connected in parallel after voltage equalization is performed on these batteries, and power is then supplied to the load.

As an example, JP 2018-042342 A discloses a voltage equalization method for a power source apparatus of a vehicle drive system that includes batteries connected in parallel (battery stack) supplying power to a load made up of a motor generator and a drive circuit (including a smoothing capacitor and inverter) that drives the motor generator.

In the voltage equalization method disclosed in JP 2018-042342 A, in a case where there is a voltage difference between two batteries after operation of the power source apparatus has stopped (S12), as shown in FIGS. 2 and 5 thereof, for example, the parallel connection between the batteries is established through a precharge resistor. By causing the current to flow through the precharge resistor from the battery with high voltage to the battery with low voltage, the voltage difference between these batteries is reduced (paragraphs [0034] and [0035] of JP 2018-042342 A).

SUMMARY OF THE INVENTION

In the voltage equalization method disclosed in JP 2018-042342 A, after the operation of the power source apparatus has been stopped, the voltage equalization is performed for each of the batteries and then the power source apparatus is reactivated. When reactivating the power source apparatus, the batteries are connected in parallel after the smoothing capacitor has been charged, via the precharge resistor, by whichever battery is provided with this precharge resistor (paragraph [0015] of JP 2018-042342 A).

However, in the voltage equalization method disclosed in JP 2018-042342 A, there is a problem that, when the power source apparatus is activated, a voltage inequality (voltage difference) occurs between the battery that supplies power to the smoothing capacitor and the battery that does not supply power to the smoothing capacitor.

Furthermore, there is a problem that when there is a long idle time after the batteries have been used, a voltage difference occurs due to a difference in the self-discharge of the batteries or the like.

The present invention has been devised taking into consideration the aforementioned problems, and has the object of providing a battery control apparatus for a power supply system that makes it possible to efficiently eliminate voltage inequality among batteries connected in parallel, even when a capacitor is connected in parallel with the load to which power is being supplied.

Furthermore, the present invention has the objective of providing a battery control apparatus for a power supply system that makes it possible to efficiently eliminate voltage inequality among batteries connected in parallel, even when there is a long battery idle time.

A battery control apparatus for a power supply system according to one aspect of the present invention includes: a capacitor that is connected in parallel with a load and supplies power to the load; and a plurality of batteries that supply power to the capacitor to thereby charge the capacitor and supply power to the load, the batteries being connectable in parallel to each other, wherein: before power is supplied to the load from the capacitor and the plurality of batteries, one or more batteries for initially supplying power for charging to the capacitor are determined, from among the plurality of batteries, based on a result of acquiring a voltage of each battery; and voltage equalization among the plurality of batteries is performed in response to power for charging being supplied to the capacitor from the determined one or more batteries.

According to the present invention, before power is supplied to the load from the capacitor, a battery for initially supplying power for charging to the capacitor, among the plurality of batteries, is determined based on the result of acquiring a voltage of each battery, and voltage equalization among the plurality of batteries is performed in response to power for charging being supplied to the capacitor from the determined battery.

Therefore, even in a case where the capacitor is connected in parallel with the load to which power is to be supplied, it is possible to efficiently eliminate voltage inequality among the batteries connected in parallel. Furthermore, since the voltage equalization is performed before the power is supplied to the load, it is possible to reliably perform voltage equalization even when there is a long idle time after the batteries are used.

The above and other objects, features, and advantages of the present invention will become more apparent from the following description when taken in conjunction with the accompanying drawings, in which a preferred embodiment of the present invention is shown by way of illustrative example.

DESCRIPTION OF THE INVENTION

Preferred embodiments of a battery control apparatus for a power supply system according to the present invention will be presented and described below with reference to the accompanying drawings.

[Configuration]

Figure 1:
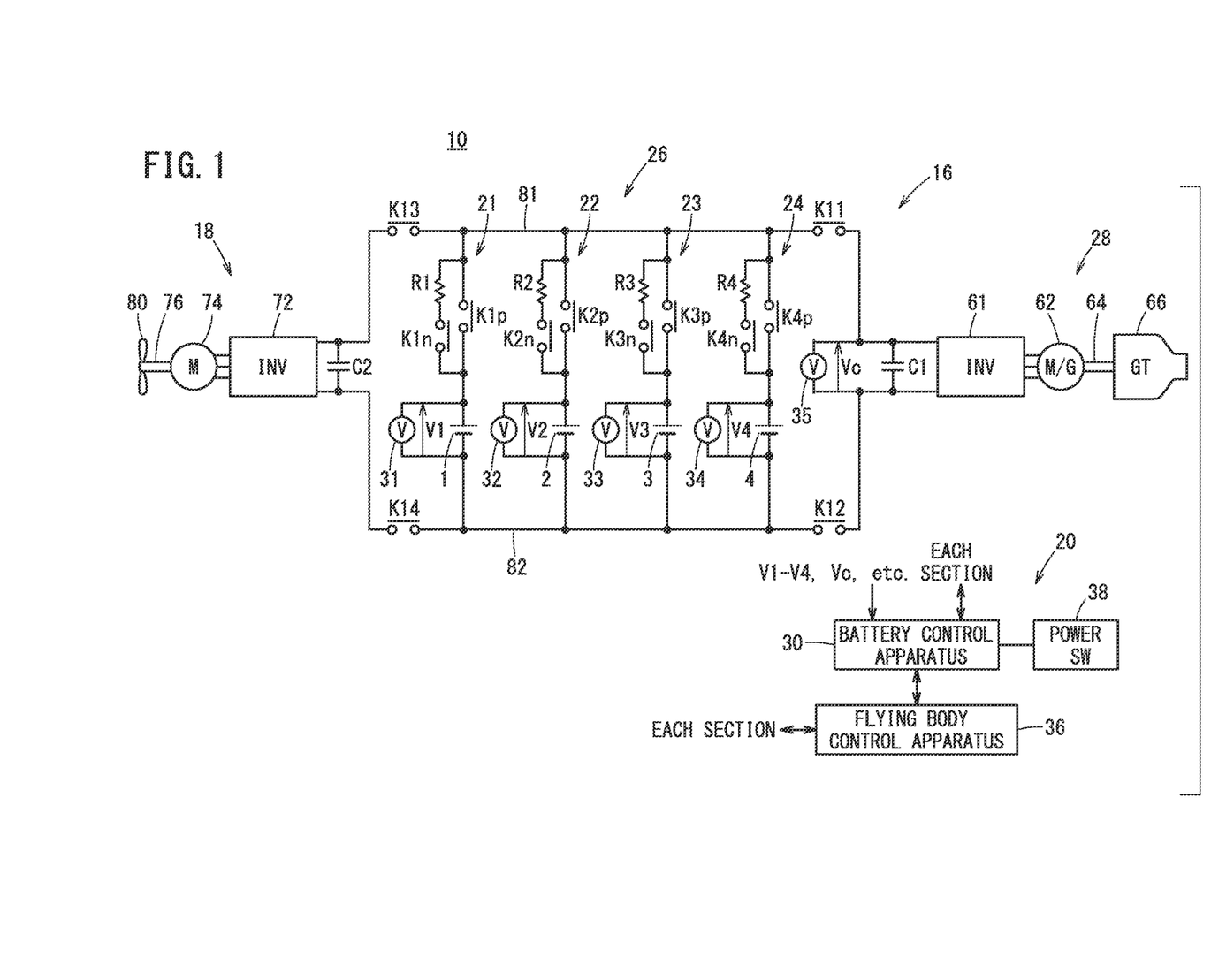
FIG. 1 is a block diagram showing a schematic configuration of an electric flying body in which a power supply system according to an embodiment is loaded.

FIG. 1 is a block diagram showing a schematic configuration of an electric flying body 10 in which a power supply system 16 according to an embodiment is loaded.

The electric flying body 10 is basically formed from the power supply system 16, a thrust generating section 18 that is supplied with electric power from the power supply system 16 to generate thrust, and a control section 20 that controls the overall electric flying body 10 including the power supply system 16 and the thrust generating section 18.

The control section 20 is formed from a battery control apparatus 30 and a flying body control apparatus 36, which transmit and receive signals to and from each other via a communication line such as a CAN. A power switch 38 of the electric flying body 10 is connected to the battery control apparatus 30.

The battery control apparatus 30 and the flying body control apparatus 36 are each formed from a microcomputer including a CPU, a memory (ROM and RAM), a timer, and the like, and each function as various function sections (function means) by having the CPU execute a program stored in the memory.

The power supply system 16 is formed from a battery section 26 and a power generating section 28.

The battery section 26 includes a plurality of batteries, which in this case is four batteries 1 to 4, as an example. The four batteries 1 to 4 are respectively formed as battery modules 21 to 24.

In the present embodiment, the specifications of the batteries 1 to 4 are that each battery is a high-voltage laminated lithium-ion secondary battery that generates the same voltage and has the same power capacity. However, the present invention can be applied to a case where there is variation among the power capacity specifications of the batteries 1 to 4 or a case where the batteries 1 to 4 are other types of secondary batteries. The laminated lithium-ion secondary battery is an assembled battery that generates a high voltage by connecting single cells in series.

The battery modules 21 to 24 are connected in parallel between a positive electrode bus 81 and a negative electrode bus 82.

The battery module 21 is formed of the battery 1 that has a voltage sensor 31 connected thereto and whose negative electrode side is connected to the negative electrode bus 82, a precharge resistor R1, a precharge contactor (also referred to simply as a contactor) Kin, and a main contactor (also referred to simply as a contactor) K1p.

In this case, the main contactor K1p is connected in parallel to the precharge resistor R1 and precharge contactor Kin, which are connected in series. One end of the main contactor K1p is connected to the positive electrode bus 81, and the other end of the main contactor K1p is connected to the positive terminal side of the battery 1.

The other battery modules 22 to 24 are formed of the same configurational elements as the battery module 21 in the same connection state.

One end of a contactor K11 and one end of a contactor K13 are connected respectively to the ends of the positive electrode bus 81, and one end of a contactor K12 and one end of a contactor K14 are connected respectively to the ends of the negative electrode bus 82.

All of the contactors K1p to K4p, Kin to K4n, and K11 to K14 are electromagnetic contactors that have normally-open connection points, and are configured such that the connection points close (contactors close) when power is supplied to the respective coils (not shown in the drawings) from the battery control apparatus 30.

The battery control apparatus 30 acquires battery voltages Vb (Vb=V1, V2, V3, V4) of the batteries 1 to 4 from the voltage sensors 31 to 34. Furthermore, the battery control apparatus 30 acquires battery currents flowing through the batteries 1 to 4 using current sensors (not shown in the drawings). Yet further, the battery control apparatus 30 acquires battery temperatures of the batteries 1 to 4 using temperature sensors (not shown in the drawings), and manages the SOC (state of charge), which is the remaining capacity, of each battery 1 to 4.

A capacitor C1, which is a smoothing capacitor serving as a load of the battery section 26 during startup (when the power switch 38 is ON), and an input side of an inverter 61 are connected to the other ends of the contactors K11 and K12. The inter-terminal voltage (capacitor voltage) Vc of the capacitor C1, that is, the input end voltage of the inverter 61, is measured by a voltage sensor 35 provided to an inverter control apparatus (not shown in the drawings) that controls driving of the inverter 61. The measured capacitor voltage Vc is transmitted to the battery control apparatus 30 via a communication line such as a CAN (not shown in the drawings), and acquired by the battery control apparatus 30.

Under the control of the inverter control apparatus (not shown in the drawings), at startup, the inverter 61 converts the DC (direct current) voltage (capacitor voltage) Vc generated at the ends of the charged capacitor C1 into three-phase AC (alternating current), and causes a main shaft 64 of a motor generator 62 to rotate.

The main shaft 64 of the motor generator 62 causes the rotor and turbine of a compressor of a gas turbine 66 to rotate integrally. Then, fuel is supplied to a combustor of the gas turbine 66 and combusted by the gas turbine 66, and the gas turbine 66 starts rotating due to the fuel.

At this time, the inverter control apparatus (not shown in the drawings) causes the motor generator 62 to operate as a power generator in which the main shaft 64 is rotated by the gas turbine 66, and converts the AC power generated by the power generator into DC power, through the inverter 61, to charge the batteries 1 to 4 forming the battery section 26.

Under the control of the flying body control apparatus 36, the charged DC power of the batteries 1 to 4 is converted into AC power through a capacitor C2 and inverter 72 forming the thrust generating section 18, via the contactors K13 and K14, a main shaft 76 of a motor 74 is rotated by this AC power, and a propeller 80 for generating thrust, which is connected to the main shaft 76, is rotated.

In the present embodiment, the electric flying body 10 is a vertical takeoff and landing aircraft, and includes eight propellers for vertical takeoff and landing and two propellers for horizontal flying. The electric flying body 10 is not limited to this configuration, and may be a vertical takeoff and landing aircraft that includes two or more propellers for vertical takeoff and landing and one or more propellers for horizontal flying, or some other type of electric flying body.

[Operation]

The following describes the operation, including the process of voltage equalization of the batteries 1 to 4, performed by the battery control apparatus 30 of the power supply system 16 configured basically in the manner described above, while referencing the flow chart of FIG. 2. Unless otherwise specified, the component performing the processing shown in the flow chart is a CPU of the battery control apparatus 30 or a CPU of the flying body control apparatus 36 or another dedicated ECU (not shown in the drawings), but since it would be complicated to refer to this each time, it is only referred to as needed.

Figure 2:
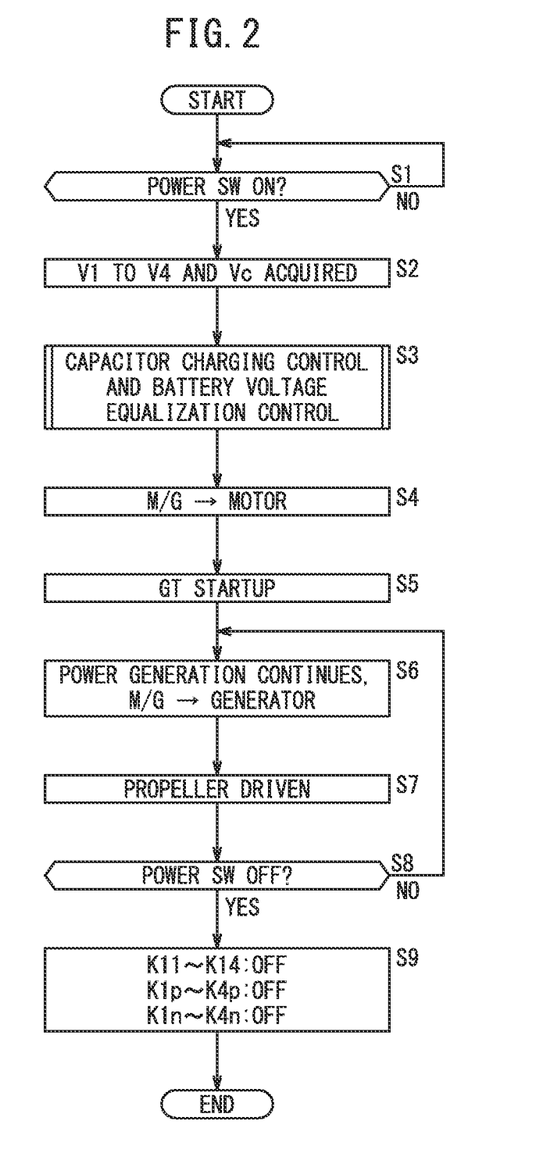
FIG. 2 is a flow chart provided to describe an operation including a battery voltage equalization process performed by the battery control apparatus of the power supply system.

At step S1, monitoring is performed to check whether the power switch 38 of the electric flying body 10 has changed from the OFF state to the ON state. When it is judged that the power switch 38 has changed to the ON state (step S1: YES), at step S2, the battery voltages Vb (Vb=V1, V2, V3, V4) of the batteries 1 to 4 and the capacitor voltage Vc of the capacitor C1 are acquired through the voltage sensors 31 to 35.

It should be noted that, when the power switch 38 is in the OFF state, and at the timing when the power switch 38 switches from the OFF state to the ON state, all of the contactors K1p to K4p, Kin to K4n, and K11 to K14 are open (i.e., all the electric currents are cut off).

Next, at step S3, charging is performed so that inrush current does not flow into the capacitor C1, and the voltage equalization process is performed so that inrush current does not flow between the batteries 1 to 4.

In practice, in a state where the inverters 61 and 72 have been controlled to be in a stopped state, the contactors K11 to K14 are closed and charging is performed with the capacitor C1 and capacitor C2 in a parallel state. But here, in order to avoid unnecessary complexity and to facilitate understanding, the process of performing precharging so that inrush current does not occur in the capacitor C1 in a state where the contactors K11 and K12 are closed and the contactors K13 and K14 are open, and of equalizing the battery voltages, is described in the order of [1] to [4] below.

[1] Normal precharging and voltage equalization process {a case where each battery voltage Vb is a voltage indicating a target remaining capacity (target SOC)}.

In the present embodiment, the target SOC is set to a value that avoids the high remaining capacity side in which deterioration of the batteries 1 to 4 is small, for example. This target SOC is the target SOC during charging/discharging control of the batteries 1 to 4 by the battery control apparatus 30 when the gas turbine 66 performs combustion and the motor generator 62 operates as a power generator.

The SOC is correlated with the voltage, and therefore the battery voltage Vb corresponding to the target SOC is described as a threshold voltage Vth.

[2] (First Embodiment Example) The precharging and voltage equalization process is performed in a case where, among the batteries 1 to 4, the SOC of one battery is the target SOC (including a state where the SOC is approximately the same as the target SOC, and this is also true in the following descriptions) and the SOCs of the remaining three batteries are lower than the target SOC.

[3] (Second Embodiment Example) The precharging and voltage equalization process is performed in a case where, among the batteries 1 to 4, three batteries have the target SOC and the SOC of the remaining one battery is lower than the target SOC.

[4] (Third Embodiment Example) The precharging and voltage equalization process is performed in a case where the SOCs of all of the batteries 1 to 4 are lower than the target SOC, and there is variation among these SOCs.

[1] Description of Normal Precharging and Voltage Equalization Process (a Case where V1=V2=V3=V4=Vth)

The description is provided while referencing the operational schematic diagrams of FIGS. 3A to 3D.

In the operational schematic diagrams of FIGS. 3A to 3D, configurational elements corresponding to configurational elements shown in FIG. 1 are given the same reference numerals. The same is true for the operational schematic diagrams in the other descriptions below (FIGS. 4A to 4D, 5A to 5D, and 6A to 6D).

Figure 3A:
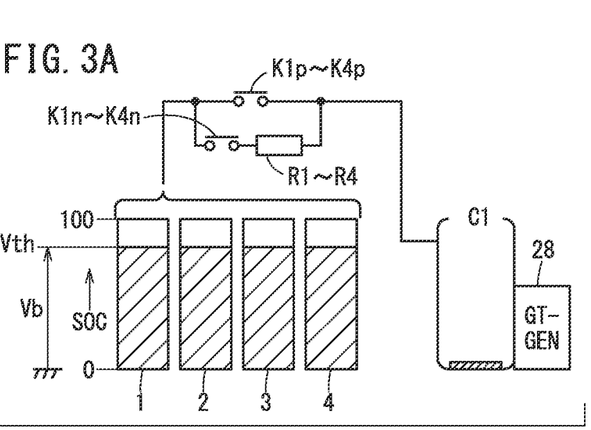
FIG. 3A is a descriptive diagram showing a state before charging of the capacitor when the SOCs (States Of Charge) of all of the batteries are a target SOC.
Figure 3B:
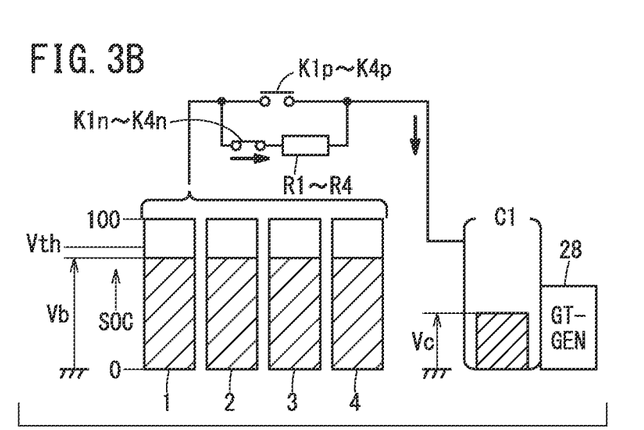
FIG. 3B is a descriptive diagram showing a state of charging the capacitor with four batteries.

As shown in FIG. 3A, in a case where the difference among the battery voltages Vb of the batteries 1 to 4 is within an inrush current prevention voltage difference (prescribed voltage range) ΔVp, the capacitor C1 is charged from the batteries 1 to 4 via the respective precharge resistors R1 to R4 in a state where the contactors K1p to K4p (see FIG. 1) are open (contactors K11 and K12 are already in a closed state) and the contactors Kin to K4n are closed, such that an excessive inrush current does not occur, as shown in FIG. 3B.

Here, a case in which the difference among the battery voltages Vb of the batteries 1 to 4 is within the inrush current prevention voltage difference ΔVp is referred to as a case in which the voltage difference |Vb−Vb*| between the battery voltage Vb of one battery and the battery voltage Vb of another battery (referred to as Vb*) has a relationship of |Vb−Vb*| ΔVp. In other words, this is a case where voltage equalization of the batteries 1 to 4 has been achieved (i.e., a case where the voltage equalization process is unnecessary).

The inrush current prevention voltage difference ΔVp for the batteries 1 to 4 is a voltage difference that does not cause an excessive inrush current to flow from a battery with high voltage among the batteries 1 to 4 to a battery with low voltage among the batteries 1 to 4, even when the contactors K1p to K4p are closed and the batteries 1 to 4 are connected in parallel. Here, the contactors K1p to K4p are closed for the equalization process that makes the battery voltages V1 to V4 of the batteries 1 to 4 the same voltage. In other words, the inrush current prevention voltage difference ΔVp is a predetermined voltage range in which a tolerably small inrush current, which is limited by the battery voltage difference |Vb−Vb*| and the internal resistances of the batteries 1 to 4, flows.

Figure 3C:
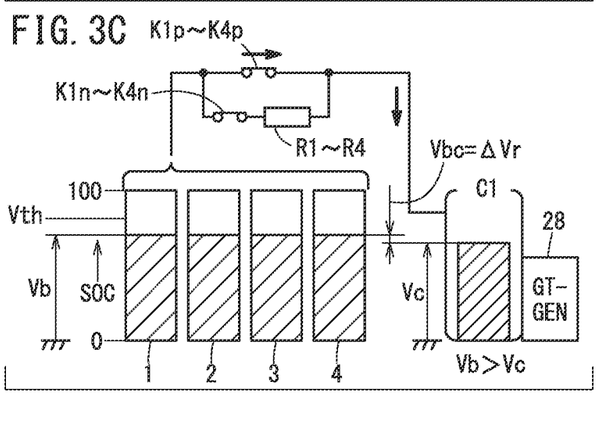
FIG. 3C is a descriptive diagram provided to describe voltage differences between the battery voltages and the capacitor voltage.

As shown in FIG. 3C, when the charging progresses and the voltage difference Vbc (Vbc=Vb−Vc) between the voltage Vc of the capacitor C1 and the battery voltage Vb (here, V1=V2=V3=V4) has become a value less than or equal to an inrush current prevention voltage difference ΔVr at which a current less than or equal to the tolerable inrush current is guaranteed {(Vb−Vc) ΔVr}, the contacts K1p to K4p are closed. The inrush current prevention voltage difference ΔVr, which makes it possible to limit the inrush current flowing from the batteries 1 to 4 to the capacitor C1 to be less than or equal to a prescribed current when the batteries 1 to 4 and the capacitor C1 have become directly connected, is determined in advance according to a combination of the batteries 1 to 4 and the capacitor C1.

It should be noted that the contactors Kin to K4n may be opened before the contactors K1p to K4p are closed. The same is also true below. However, in the interest of preventing aging degradation of the contactors Kin to K4n that is dependent on the number of opening/closing cycles of the connection points or the like, it is preferable for the contactors Kin to K4n to be closed.

In the connection state shown in FIG. 3C, the charging of the capacitor C1 continues. In this case, the contactors K1p to K4p having closed connection points are connected in parallel respectively to the circuits in which the contactors Kin to K4n with closed connection points and the precharge resistors R1 to R4 are connected in series. In this case, the contact resistance values of the contactors K1p to K4p are extremely low compared to the resistance values of the precharge resistors R1 to R4, and therefore substantially all the currents flowing from the batteries 1 to 4 flow into the capacitor C1 through the contactors K1p to K4p.

In this manner, the process of charging the capacitor C1 through [1] the normal precharging and voltage equalization process performed for the capacitor C1 (actually including C2 as well) of step S3 is finished.

After the charging control for the capacitor C1 is finished, at step S4, the inverter 61 is driven in the state shown in FIG. 3C, and the motor generator 62 is driven as a motor via the driven inverter 61 to rotate the main shaft 64.

Due to the rotation of the main shaft 64, at step S5, the gas turbine 66 is started up via the motor generator 62, and the power generating section 28 starts generating power.

Figure 3D:
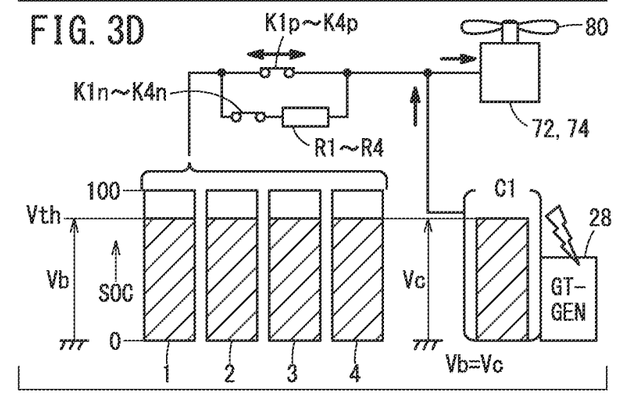
FIG. 3D is a descriptive diagram showing a state of a power source during operation of the electric flying body.

In other words, at step S6, as shown in FIG. 3D, the motor generator 62 operates as a power generator and the charging control by the battery control apparatus 30 continues in a manner to cause the battery voltages V1 to V4 of the batteries 1 to 4 connected in parallel to become the threshold voltage Vth corresponding to the target SOC due to the power of the power generating section 28.

At the same time, at step S7, the propeller 80 can rotate via the motor 74 by driving the motor 74 through the inverter 72 using the power of the capacitor C2 and the batteries 1 to 4 connected in parallel. Due to this, the thrust generating section 18 becomes able to operate (enables vertical takeoff and landing, and horizontal flight or vertical flight after the vertical takeoff) under the control of the flying body control apparatus 36.

Next, at step S8, the flight of the electric flying body 10 continues until the power switch 38 is set to the OFF state (step S8: NO→step S6: power generation continues→step S7: rotational driving of propeller 80).

The electric flying body 10 lands at a prescribed location and, at step S8, when the power switch 38 is switched from the ON state to the OFF state (step S8: YES), at step S9, the contactors K11 to K14, K1p to K4p, and Kin to K4n are all set to the OFF state and the process of the flow chart is finished.

When this process is finished, in order to avoid danger, the capacitors C1 and C2 are discharged through a discharge circuit (not shown in the drawings), so that the capacitor voltages Vc become less than or equal to a prescribed voltage.

2 First Embodiment Example

Description of Precharging and Voltage Equalization Process in Case where, Among Batteries 1 to 4, SOC of One Battery is Target SOC and SOCs of the Remaining Three Batteries are Lower than Target SOC (a Process of Preventing Inrush Current from Flowing into the Capacitor C1 and a Process of Voltage Equalization Among the Batteries 1 to 4 while Preventing Inrush Current, which are the Same in the Cases Below)

The description is given while referencing the operational schematic diagrams of FIGS. 4A to 4D.

Figure 4A:
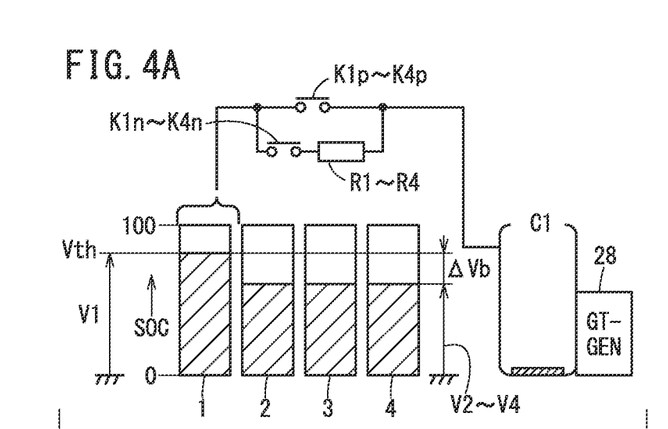
FIG. 4A is a descriptive diagram showing a state before charging of the capacitor and performance of the battery voltage equalization process when the SOC of one battery is the target SOC and the SOCs of the remaining three batteries are lower than the target SOC.

This process is performed in a case where, as shown in FIG. 4A, the battery voltage V1 of the battery 1 is approximately the threshold voltage Vth (V1≈Vth), but the battery voltages V2 to V4 of the remaining batteries 2 to 4 are lower than the threshold voltage Vth (V2 to V4<Vth≈V1).

Figure 4B:
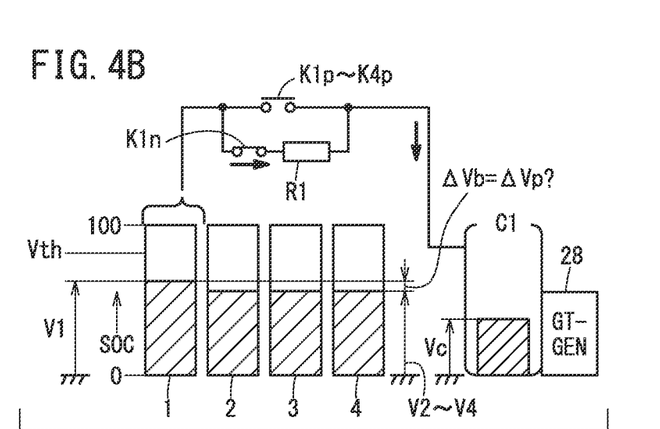
FIG. 4B is a descriptive diagram showing a state of charging the capacitor with the one battery having the target SOC.

As shown in FIG. 4B, in a state where the contactors K1p to K4p and K2n to K4n are open, only the contactor Kin of the battery 1 that has a high battery voltage Vb is closed. Due to this, the inrush current to the capacitor C1 does not become excessive, and the capacitor C1 is charged from only the battery 1 in the high-voltage state through the contactor Kin and the precharge resistor R1.

Next, when the voltage differences ΔVb (V1−V2, V1−V3, V1−V4) between the battery voltage V1 of the battery 1 and the battery voltages V2 to V4 of the remaining batteries 2 to 4 have become the inrush current prevention voltage difference ΔVp, the corresponding contactors K2n to K4n are closed.

As an example, when the voltage difference ΔVb=(V1−V2) has dropped to the inrush current prevention voltage difference ΔVp, the contactor K2n is closed, thereby realizing voltage equalization between the battery 1 and the battery 2 and continuing the charging of the capacitor C1 from the voltage-equalized batteries 1 and 2 through the respective precharge resistors R1 and R2.

Under similar conditions below, at the same time that voltage equalization of the batteries 1 to 4 is performed by sequentially closing the contactors K3n and K4n of the remaining batteries 3 and 4, excluding the batteries 1 and 2 that are supplying power to the capacitor C1, the charging of the capacitor C1 continues from the voltage-equalized batteries 1 to 4 through the respective precharge resistors R1 to R4.

Figure 4C:
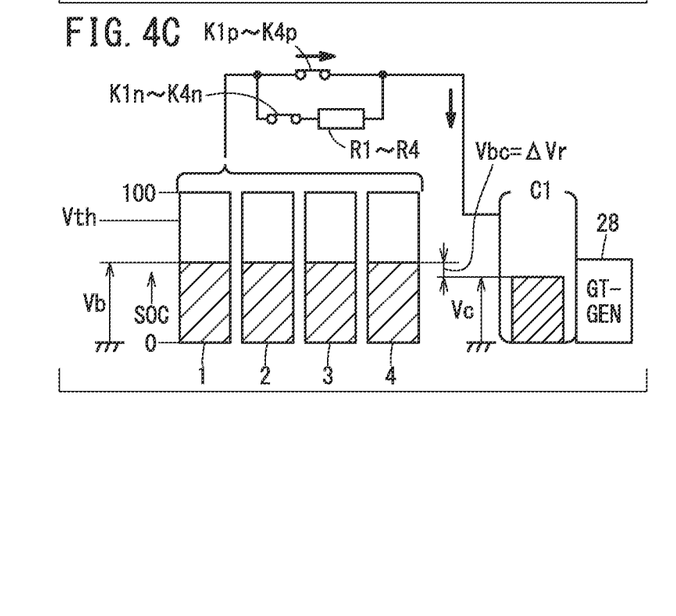
FIG. 4C is a descriptive diagram of a state during performance of the battery voltage equalization process.

In this way, as shown in FIG. 4C, when the charging progresses and the differential voltage Vbc (Vbc=Vb−Vc) between the voltage Vc of the capacitor C1 and the battery voltage Vb (Vb=V1 to V4) has become a value less than or equal to the inrush current prevention voltage difference ΔVr at which a current less than or equal to the tolerable inrush current for the capacitor C1 is guaranteed (Vbc=(Vb−Vc) ΔVr), the contactors K1p to K4p are closed.

Due to this, the currents flowing from the batteries 1 to 4 flow to the capacitor C1 through the contactors K1p to K4p.

In this manner, the process of charging the capacitor C1 (actually including C2 as well) of step S3 and the process of voltage equalization of the batteries 1 to 4 are finished.

In the process of FIG. 4B to FIG. 4C according to the first embodiment example described above, in a state where the capacitor C1 is being precharged by only the battery 1, when a voltage difference ΔVb between the battery voltage V1 of the battery 1 that is in the midst of voltage-dropping and the battery voltages V2 to V4 of the batteries 2 to 4 before the voltage equalization process has dropped to the inrush current prevention voltage difference ΔVp, the contactors K2n to K4n are closed and the voltage equalization process is performed for the batteries 2 to 4. After the voltage equalization process for the batteries 2 to 4 has been performed, the precharging of the capacitor C1 by the batteries 1 to 4 continues through the contactors Kin to K4n and precharge resistors R1 to R4. However, the present invention is not limited to this, and may be configured as shown in a first modification.

[First Modification]

In this case, in a state (FIG. 4B) where the capacitor C1 is being precharged by only the battery 1 through the precharge resistor R1, when the battery voltage V1 of the battery 1 whose inter-terminal voltage (battery voltage V1) is in the midst of dropping has dropped to the same voltage as the battery voltages V2 to V4 of the batteries 2 to 4 (ΔVb=0), that is, when the battery voltage equalization process has substantially been finished, the contactors K2n to K4n are closed. Then, the processing may be changed to continue precharging the capacitor C1 with the batteries 1 to 4 through the contactors Kin to K4n and precharge resistors R1 to R4.

In the first embodiment example and the first modification, if the SOCs of the batteries 2 to 4 are much smaller than the SOC of the battery 1, the precharging of the capacitor C1 is finished with only the battery 1 and the power generating section 28 is made to operate, after which processing may be performed to equalize the voltages of the remaining batteries 2 to 4 using the battery 1.

In this case, when the potential differences between the battery voltages V2 to V4 and the battery voltage V1 have become less than or equal to the inrush current prevention voltage difference ΔVp, the voltage equalization process is performed by sequentially shorting the precharge resistors R2 to R4 with the contactors K2p to K4p.

Next, a simple description of the processing from step S4 described above will be provided.

At step S4, in the state shown in FIG. 4C, the motor generator 62 is driven via the inverter 61, and at step S5, the gas turbine 66 is started up via the motor generator 62 to start the power generation by the power generating section 28.

Figure 4D:
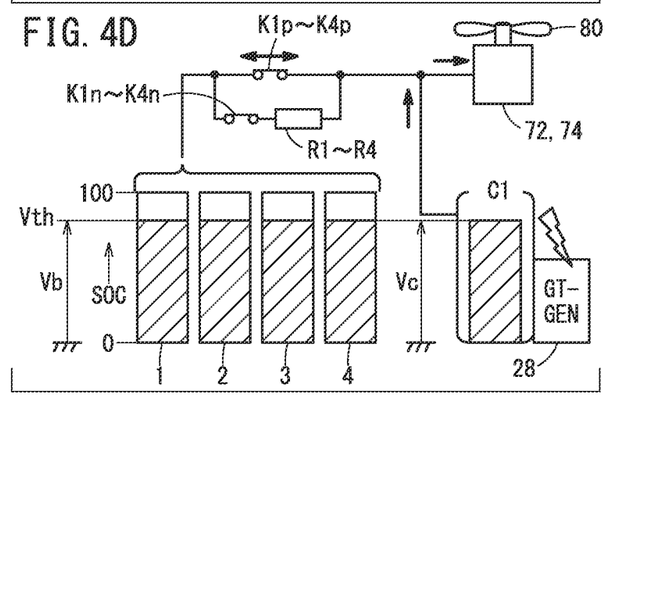
FIG. 4D is a descriptive diagram showing a state of a power source during operation of the electric flying body.

After this, at step S6, as shown in FIG. 4D, charging control is performed such that the battery voltages V1 to V4 of the batteries 1 to 4 become the threshold voltage Vth corresponding to the target SOC using the power of the power generating section 28, and the motor generator 62 continues to operate as a power generator.

At step S7, the propeller 80 becomes able to rotate due to the power of the batteries 1 to 4. Due to this, the thrust generating section 18 is able to perform the various flight operations described above under the control of the flying body control apparatus 36.

3 Second Embodiment Example

Description of Precharging and Voltage Equalization Process in Case where, Among Batteries 1 to 4, Three Batteries have Approximately Target SOC and SOC of the Remaining One Battery is Lower The description is provided while referencing the operational schematic diagrams of FIGS. 5A to 5D.

Figure 5A:
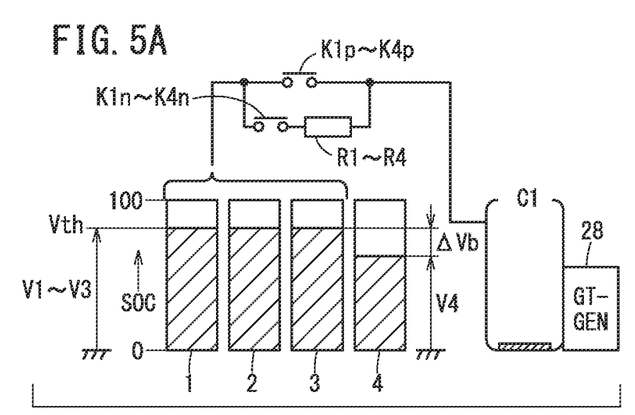
FIG. 5A is a descriptive diagram showing a state before charging of the capacitor and performance of the battery voltage equalization process when the SOCs of three batteries are the target SOC and the SOC of the remaining one battery is lower than the target SOC.

As shown in FIG. 5A, a case is described in which the battery voltages V1 to V3 of the batteries 1 to 3 are approximately the same as the threshold voltage Vth, but the battery voltage V4 of the remaining battery 4 is lower than the threshold voltage Vth (V4<Vth).

In this case, in a state where the contactors K1p to K4p are open, the contactors Kin to K4n are closed.

Figure 5B:
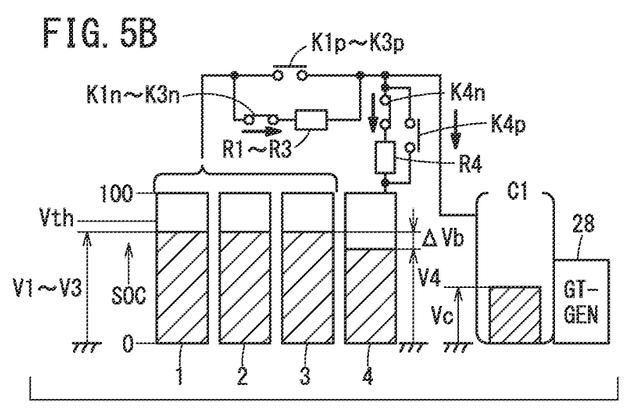
FIG. 5B is a descriptive diagram showing the battery voltage equalization process with the three batteries having the target SOC and a state of charging the capacitor.

Due to this, as shown in FIG. 5B, the voltage equalization process is performed on the batteries 1 to 4 by charging the battery 4 having a low voltage via the precharge resistors R1 to R3 and the precharge resistor R4 up to the same voltage as the batteries 1 to 3, and the capacitor C1 is charged from the batteries 1 to 4 in a range where the inrush current is not excessive, through the respective precharge resistors R1 to R4.

In FIG. 5B according to the second embodiment example, the precharging of the capacitor C1 and the charging of the battery 4 by the batteries 1 to 3 are performed at the same time, but the timing is not limited to this, and may be changed as shown in a second modification.

[Second Modification]

As an example, in the state shown in FIG. 5A, the contactors Kin to K3n are closed while the contactor K4n is kept open, and precharging of the capacitor C1 by the batteries 1 to 3 is prioritized. Then, when the potential differences ΔVb between the battery voltages V1 to V3 of the batteries 1 to 3 and the battery voltage V4 of the battery 4 have become zero (when the battery voltages have become the same), or when these voltage differences ΔVb have dropped to the inrush current prevention voltage difference ΔVp, voltage equalization of the batteries 1 to 4 may be performed by closing the contactor K4n.

Which of the process of performing voltage equalization of the battery 4 prioritizing precharging of the capacitor C1 in this way or the process of performing the voltage equalization of the battery 4 at the same time as the precharging of the capacitor C1 from the start such as shown in FIG. 5B should be adopted can be determined in advance in consideration of the SOCs of the batteries 1 to 4 and the electrostatic capacitance of the capacitor C1. Due to this, it is possible to select the process in which the precharging and voltage equalization are finished quickly.

Figure 5C:
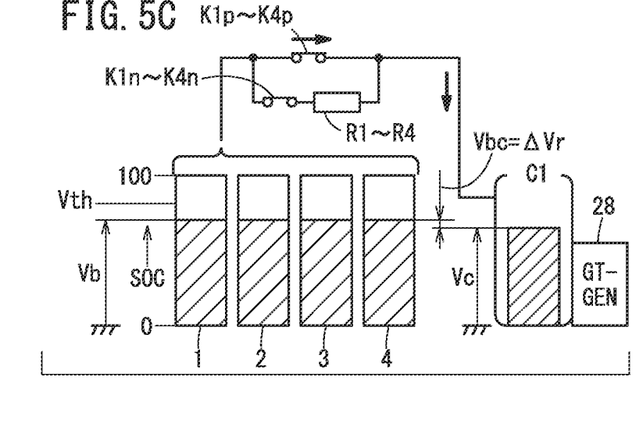
FIG. 5C is a descriptive diagram of a state after performance of the battery voltage equalization process.

In both the second embodiment example and the second modification, as shown in FIG. 5C, when the charging progresses and the differential voltage Vbc (Vbc=Vb−Vc) between the voltage Vc of the capacitor C1 and the battery voltage Vb (Vb=V1 to V4) has become a value less than or equal to the inrush current prevention voltage difference ΔVr (Vbc=(Vb-Vc) ΔVr), the contactors K1p to K4p are closed. The inrush current prevention voltage difference ΔVr is a voltage difference at which flowing of a current less than or equal to the tolerable inrush current for the capacitor C1 is guaranteed.

After this, the currents flowing from the batteries 1 to 4 flow to the capacitor C1 through the contactors K1p to K4p.

At this point, the charging control for the capacitor C1 (actually including C2 as well) of step S3 is finished.

Next, a simple description of the processing from step S4 described above will be provided.

At step S4, in the state shown in FIG. 5C, the motor generator 62 is driven via the inverter 61, and at step S5, the gas turbine 66 is started up via the motor generator 62 to start the power generation by the power generating section 28.

Figure 5D:
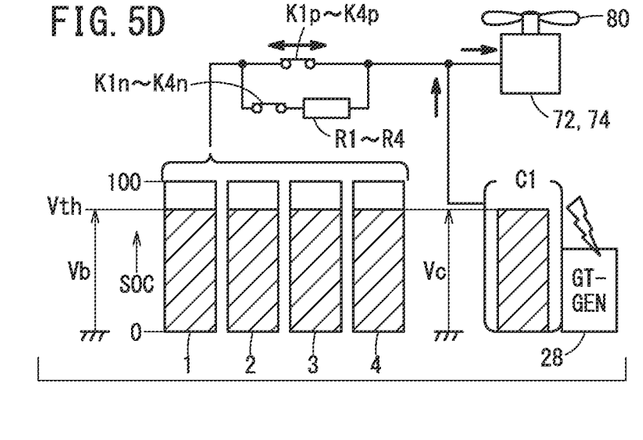
FIG. 5D is a descriptive diagram showing a state of a power source during operation of the electric flying body.

At step S6, as shown in FIG. 5D, charging control is performed such that the battery voltages V1 to V4 of the batteries 1 to 4 become the threshold voltage Vth corresponding to the target SOC using the power of the power generating section 28, and the motor generator 62 continues to operate as a power generator.

At step S7, the propeller 80 becomes able to rotate due to the power of the batteries 1 to 4. Due to this, the thrust generating section 18 is able to perform the various flight operations described above under the control of the flying body control apparatus 36.

4 Third Embodiment Example

Description of Precharging and Voltage Equalization Process in Case where SOCs of all of Batteries 1 to 4 are Lower than Target SOC (Threshold Voltage Vth) and there is Variation Among these SOCs The description is provided while referencing the operational schematic diagrams of FIGS. 6A to 6D.

Figure 6A:
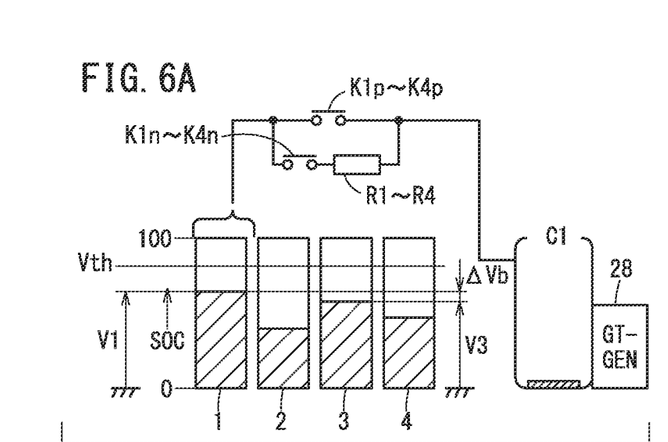
FIG. 6A is a descriptive diagram showing a state before charging of the capacitor and performance of the battery voltage equalization process when there is variation among the SOCs of the four batteries.

A case will be described in which, as shown in FIG. 6A, the battery voltages V1 to V4 of the batteries 1 to 4 are lower than the threshold voltage Vth and have variations resulting in a relationship of Vth>V1>V3>V4>V2.

Figure 6B:
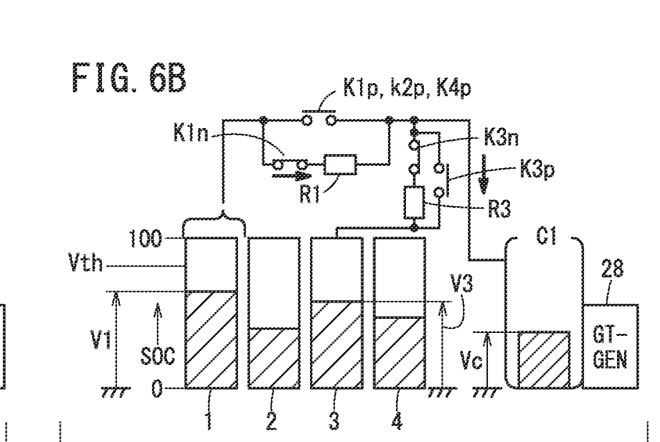
FIG. 6B is a descriptive diagram showing performing the battery voltage equalization process on the battery having the highest voltage and the battery having the second highest voltage and a state of charging the capacitor.

In this case, first, as shown in FIG. 6B, in a state where the contactors K1p to K4p are in the open state, the contactor K1n of the battery 1 having the highest battery voltage Vb (Vb=V1) and the contactor K3n of the battery 3 having the second highest battery voltage Vb (Vb=V3) are closed.

Due to this, the battery voltage V3 of the battery 3 is charged up to the same voltage as the battery voltage V1 of the battery 1 through the precharge resistors R1 and R3, and voltage equalization is achieved for the battery voltages V1 and V3 of the batteries 1 and 3 (the battery voltage V1 at this timing has become lower than the battery voltage V1 shown in FIG. 6A). Along with the voltage equalization of the battery voltages V1 and V3 of the batteries 1 and 3, the capacitor C1 is charged from the battery 1 in a range where the inrush current does not become excessive, through the precharge resistor R1. Then, after the voltage equalization has been achieved for the battery 1 and the battery 3 (V1=V3), the capacitor C1 is charged from the batteries 1 and 3 through the respective precharge resistors R1 and R3.

Although not shown in the drawings, in the state shown in FIG. 6B, the contactor K4n of the battery 4 having the third highest battery voltage Vb is closed and charging is performed through the precharge resistors R1, R3, and R4 until the battery voltage V4 of the battery 4 becomes the same voltage as the battery voltage Vb of the batteries 1 and 3 (Vb=V1=V3), thereby achieving voltage equalization of the batteries 1, 3, and 4. Along with the voltage equalization of the batteries 1, 3, and 4, the capacitor C1 is charged from the equalized batteries 1, 3, and 4 in a range where the inrush current does not become excessive, through the respective precharge resistors R1, R3, and R4.

In a similar manner, although not shown in the drawings, the contactor K2n of the battery 2 having the fourth highest battery voltage Vb is closed and charging is performed through the precharge resistors R1, R2, R3, and R4 until the battery voltage V2 of the battery 2 becomes the same voltage as the battery voltage Vb of the batteries 1, 3, and 4 (Vb=V1=V3=V4), thereby achieving voltage equalization of the batteries 1 to 4. Along with the voltage equalization of the batteries 1 to 4, the capacitor C1 is charged from the equalized batteries 1 to 4 in a range where the inrush current does not become excessive, through the respective precharge resistors R1 to R4.

In FIG. 6B, the precharging of the capacitor C1 and the charging of the battery 3 are performed at the same time, but the timing is not limited to this, and may be changed as shown in a third modification.

[Third Modification]

Initially focusing on the battery 1 that has the highest battery voltage V1, only the contactor K1n of this battery 1 is closed to precharge the capacitor C1. The battery voltage V1 of the battery 1 decreases in accordance with the precharging of the capacitor C1. When the battery voltage V1 decreases and the potential difference ΔVb between the battery voltage V1 and the battery voltage V3 of the battery 3 has become zero (when these voltages have become the same), the contactor K3n is closed. Alternatively, when the battery voltage V1 decreases and the potential difference ΔVb between the battery voltage V1 and the battery voltage V3 has dropped to the inrush current prevention voltage difference ΔVp, that is, after voltage equalization has been achieved, the contactor K3n is closed. By closing the contactor K3n, the precharging of the capacitor C1 is performed by the batteries 1 and 3. The same is true for the other batteries 2 and 4 as well.

Figure 6C:
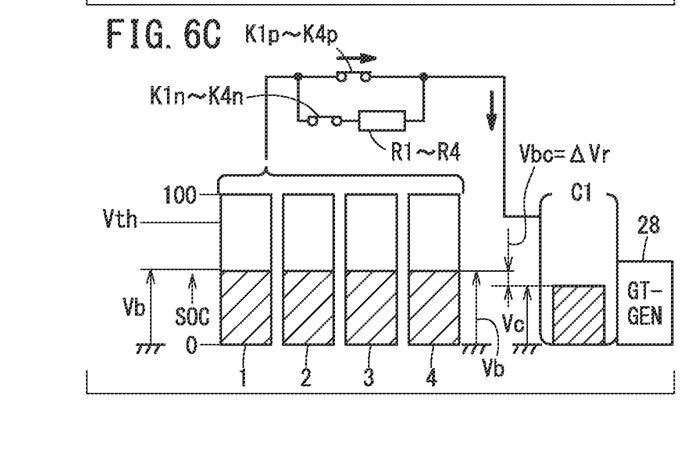
FIG. 6C is a descriptive diagram of a state after performance of the battery voltage equalization process.

In both the third embodiment example and the third modification, as shown in FIG. 6C, when the charging progresses and the differential voltage Vbc (Vbc=Vb-Vc) between the voltage Vc of the capacitor C1 and the battery voltage Vb (Vb=V1 to V4) has become a value less than or equal to the inrush current prevention voltage difference ΔVr at which flowing of a current less than or equal to the tolerable inrush current for the capacitor C1 is guaranteed (Vbc ΔVr), the contactors K1p to K4p are closed.

After this, the currents flowing from the batteries 1 to 4 flow to the capacitor C1 through the contactors K1p to K4p.

At this point, the charging process for the capacitor C1 (actually including C2 as well) of step S3 is finished.

Furthermore, both the third embodiment example and the third modification can be applied to at least two batteries having a voltage level difference.

Next, a simple description of the processing from step S4 described above will be provided.

At step S4, in the state shown in FIG. 6C, the motor generator 62 is driven via the inverter 61, and at step S5, the gas turbine 66 is started up via the motor generator 62 to start the power generation by the power generating section 28.

Figure 6D:
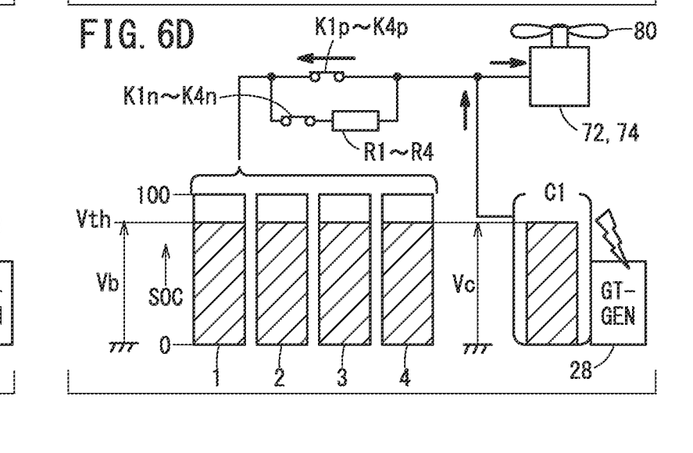
FIG. 6D is a descriptive diagram showing a state of a power source during operation of the electric flying body.

At step S6, as shown in FIG. 6D, charging control is performed such that the battery voltages V1 to V4 of the batteries 1 to 4 become the threshold voltage Vth corresponding to the target SOC using the power of the power generating section 28, and the motor generator 62 continues to operate as a power generator.

At step S7, the propeller 80 becomes able to rotate due to the power of the batteries 1 to 4. Due to this, the thrust generating section 18 is able to perform the various flight operations described above under the control of the flying body control apparatus 36.

Invention Understandable from the Embodiments

The following describes the invention that can be understood from the embodiments described above. Some configurational elements are given the reference numerals used in the embodiments in order to facilitate understanding, but these configurational elements are not limited to those elements given the reference numerals.

According to the present invention, there is provided a battery control apparatus 30 for a power supply system 16, the power supply system including: a capacitor C1 that is connected in parallel with a load and supplies power to the load; and a plurality of batteries 1 to 4 that supply power to the capacitor C1 to thereby charge the capacitor C1 and supply power to the load, the batteries being connectable in parallel to each other. Before power is supplied to the load from the capacitor C1 and the plurality of batteries 1 to 4, the battery control apparatus determines one or more batteries, from among the plurality of batteries 1 to 4, for initially supplying power for charging to the capacitor C1, based on a result of acquiring a voltage of each of the battery 1 to 4. Further, the battery control apparatus performs voltage equalization among the plurality of batteries 1 to 4, in response to power for charging being supplied to the capacitor C1 from the determined one or more batteries.

With this configuration, before power is supplied to the load from the capacitor C1, a battery for initially supplying power for charging to the capacitor C1, from among the plurality of batteries 1 to 4, is determined based on the result of acquiring a voltage of each of the battery 1 to 4; and voltage equalization among the plurality of batteries is performed in response to power for charging being supplied to the capacitor C1 from the determined battery.

Therefore, even in a case where the capacitor C1 is connected in parallel with the load to which power is to be supplied, it is possible to efficiently eliminate voltage inequality among the batteries 1 to 4 connected in parallel. Furthermore, since the voltage equalization is performed before the power is supplied to the load, it is possible to reliably perform voltage equalization even when there is a long idle time after the batteries are used.

In the battery control apparatus 30 for the power supply system: the one or more batteries for initially supplying power for charging to the capacitor C1 may be one battery that has the highest voltage among the plurality of batteries, and the remaining batteries may be set to an open state. Further, power for charging may be supplied to the capacitor from the one battery, through a precharge resistor; while power for charging is being supplied to the capacitor from the one battery, power for charging may be supplied to the capacitor also from a remaining battery whose voltage difference relative to the one battery whose voltage has decreased has become zero, through a precharge resistor; and the plurality of batteries and the capacitor may be connected in parallel by shorting the precharge resistors when voltage differences between the voltage of the capacitor and the voltages of the plurality of batteries become less than or equal to a prescribed voltage difference (corresponding to the first modification).

According to the above, the precharging of the capacitor C1 is started before the battery voltage equalization process is started, and therefore it is possible to shorten the capacitor precharging time.

In the battery control apparatus 30 for the power supply system: the one or more batteries 1 to 4 for initially supplying power for charging to the capacitor C1 may be one battery that has the highest voltage among the plurality of batteries 1 to 4, and the remaining batteries may be set to an open state; power for charging may be supplied to the capacitor C1 from the one battery, through a precharge resistor; while power for charging is being supplied to the capacitor C1 from the one battery, the one battery whose voltage has dropped and a remaining battery whose voltage difference relative to the one battery whose voltage has dropped has become less than or equal to a prescribed voltage difference may be connected via precharge resistors, to thereby perform voltage equalization between the one battery and the remaining battery, and thereafter the supply of power for charging to the capacitor C1 may be continued from the one battery and the remaining battery that have undergone the voltage equalization, through the respective precharge resistors; and similarly, voltage equalization may be performed among other remaining batteries and the batteries that have undergone voltage equalization, the capacitor C1 may be charged from all of the voltage-equalized batteries via the respective precharge resistors, and the capacitor C1 may be connected in parallel to the plurality of batteries by shorting the precharge resistors when the voltage differences between the voltage of the capacitor C1 and the voltages of the batteries become less than or equal to a prescribed voltage difference (corresponding to the first embodiment example).

According to the above, the precharging of the capacitor C1 is started before the battery voltage equalization process is started for the batteries 1 to 4, and therefore it is possible to shorten the precharging time for the capacitor C1.

In the battery control apparatus 30 for the power supply system: the one or more batteries for initially supplying power for charging to the capacitor may be a group of batteries whose voltages are higher than the voltage of a remaining battery, among the plurality of batteries, and power for charging may be supplied to the capacitor from the group of batteries whose voltages are higher than the voltage of the remaining battery, through respective precharge resistors; while power for charging is being supplied to the capacitor from the group of batteries, supply of power for charging to the capacitor may be continued, in addition to the group of batteries, also from the remaining battery whose voltage difference relative to the group of batteries whose voltages have dropped has become zero, through a precharge resistor; and the capacitor may be connected in parallel with the plurality of batteries by shorting the precharge resistors when the voltage differences between the voltage of the capacitor and the voltages of the plurality of batteries have become a prescribed voltage difference (corresponding to the second modification).

According to the above, it is possible to shorten the capacitor precharge time and the battery voltage equalization time.

In the battery control apparatus 30 for the power supply system: the one or more batteries for initially supplying power for charging to the capacitor C1 may be a group of batteries whose voltages are higher than the voltage of a remaining battery, among the plurality of batteries, power for charging may be supplied to the capacitor C1 from the group of batteries whose voltages are higher than the voltage of the remaining battery, through respective precharge resistors, and voltage equalization of the batteries may be performed by supplying power for charging to the remaining battery whose voltage is lower than the voltages of the group of batteries, through the respective precharge resistors (corresponding to the second embodiment example).

According to the above, it is possible to shorten the capacitor C1 precharge time and the battery voltage equalization time.

In the battery control apparatus 30 for the power supply system: there may be at least two batteries that have a voltage level difference; when power for charging is to be supplied to the capacitor, first, power for charging may be supplied to the capacitor from one battery, of the at least two batteries, that has the higher voltage, through a precharge resistor; while power for charging is being supplied to the capacitor from the one battery that has the higher voltage, when a voltage difference between the voltage of the one battery that has the higher voltage whose voltage has dropped and the voltage of the other battery that has the lower voltage has become zero, power for charging may be supplied to the capacitor from the at least two batteries through respective precharge resistors; and when the voltage differences between the voltage of the capacitor and the voltages of the at least two batteries have become less than or equal to a prescribed voltage difference, the capacitor may be connected in parallel to the at least two batteries by shorting the respective precharge resistors (corresponding to the third modification).

According to the above, even when there is a level difference among the battery voltages of the batteries, it is possible to efficiently perform the battery voltage equalization and the precharging of the capacitor.

In the battery control apparatus 30 for the power supply system: when power for charging is to be supplied to the capacitor C1, first, battery voltage equalization may be performed on a battery having the second highest voltage from a battery having the highest voltage, through a precharge resistor, and power for charging may be supplied to the capacitor C1 from the battery having the highest voltage and the battery having the second highest voltage, through precharge resistors; next, battery voltage equalization may be performed on a battery having the third highest voltage from the battery having the highest voltage and the battery having the second highest voltage, through the precharge resistors, and power for charging may be supplied to the capacitor C1 from the battery having the highest voltage, the battery having the second highest voltage, and the battery having the third highest voltage, through the precharge resistors; and subsequently the battery voltage equalization may be continuously performed on other batteries similarly to the above (corresponding to the third embodiment example).

According to the above, even when there is a level difference among the battery voltages V1 to V4 of the batteries 1 to 4, it is possible to efficiently perform the battery voltage equalization and the precharging of the capacitor C1.

In the battery control apparatus 30 for the power supply system, the load may be a rotary electric machine that is driven through an inverter.

According to the above, various applications can be realized using the power of the rotary electric machine.

The present invention is not limited to the electric flying body 10 described in the embodiments above, and it is obvious that various configurations can be adopted based on the content described in this specification of the present application, such as applying the present invention to electric automobiles including hybrid vehicles and fuel cell vehicles or to electric moving bodies, such as an electric boat, that use batteries as a power source and a motor as a movement drive source.

Furthermore, in the electric moving body including the electric flying body 10, the gas turbine 66 of the power generating section 28 may be replaced by an internal combustion engine such as a reciprocating engine.

What is claimed is:

1. A battery control apparatus for a power supply system, the power supply system comprising:
   a capacitor that is connected in parallel with a load and supplies power to the load; and
   a plurality of batteries that supply power to the capacitor to thereby charge the capacitor and supply power to the load, the batteries being connectable in parallel to each other,
   the battery control apparatus comprising:
   one or more processors that execute computer-executable instructions stored in a memory, wherein the one or more processors execute the computer-executable instructions to cause the battery control apparatus to:
   before power is supplied to the load from the capacitor and the plurality of batteries, determine, from among the plurality of batteries, one or more batteries for initially supplying power for charging to the capacitor, based on a result of acquiring a voltage of each of the batteries; and
   perform voltage equalization among the plurality of batteries, in response to power for charging being supplied to the capacitor from the determined one or more batteries,
   wherein:
   the one or more batteries for initially supplying power for charging to the capacitor are one battery that has a highest voltage among the plurality of batteries, and the remaining batteries are set to an open state; and
   the one or more processors cause the battery control apparatus to:
   supply power for charging to the capacitor from the one battery, through a precharge resistor;
   while power for charging is being supplied to the capacitor from the one battery, supply power for charging to the capacitor also from a remaining battery whose voltage difference relative to the one battery whose voltage has decreased has become zero, through a precharge resistor; and
   connect the plurality of batteries and the capacitor in parallel by shorting the precharge resistors when voltage differences between a voltage of the capacitor and voltages of the plurality of batteries become less than or equal to a prescribed voltage difference.

2. A battery control apparatus for a power supply system, the power supply system comprising:
   a capacitor that is connected in parallel with a load and supplies power to the load; and
   a plurality of batteries that supply power to the capacitor to thereby charge the capacitor and supply power to the load, the batteries being connectable in parallel to each other,
   the battery control apparatus comprising:
   one or more processors that execute computer-executable instructions stored in a memory, wherein the one or more processors execute the computer-executable instructions to cause the battery control apparatus to:

before power is supplied to the load from the capacitor and the plurality of batteries, determine, from among the plurality of batteries, one or more batteries for initially supplying power for charging to the capacitor, based on a result of acquiring a voltage of each of the batteries; and perform voltage equalization among the plurality of batteries, in response to power for charging being supplied to the capacitor from the determined one or more batteries, wherein:

the one or more batteries for initially supplying power for charging to the capacitor are one battery that has a highest voltage among the plurality of batteries, and the remaining batteries are set to an open state; and the one or more processors cause the battery control apparatus to: supply power for charging to the capacitor from the one battery, through a precharge resistor;

while power for charging is being supplied to the capacitor from the one battery, connect, through precharge resistors, the one battery whose voltage has dropped and a remaining battery whose voltage difference relative to the one battery whose voltage has dropped has become less than or equal to a prescribed voltage difference, to thereby perform voltage equalization between the one battery and the remaining battery, and thereafter continue supplying power for charging to the capacitor from the one battery and the remaining battery that have undergone the voltage equalization, through the respective precharge resistors; and similarly perform voltage equalization among other remaining batteries and the batteries that have undergone voltage equalization, charge the capacitor from all of the voltage-equalized batteries via the respective precharge resistors, and connect the capacitor in parallel to the plurality of batteries by shorting the precharge resistors when the voltage differences between a voltage of the capacitor and voltages of the batteries become less than or equal to a prescribed voltage difference.

3. A battery control apparatus for a power supply system, the power supply system comprising:

a capacitor that is connected in parallel with a load and supplies power to the load; and a plurality of batteries that supply power to the capacitor to thereby charge the capacitor and supply power to the load, the batteries being connectable in parallel to each other, the battery control apparatus comprising:

one or more processors that execute computer-executable instructions stored in a memory, wherein the one or more processors execute the computer-executable instructions to cause the battery control apparatus to:

before power is supplied to the load from the capacitor and the plurality of batteries, determine, from among the plurality of batteries, one or more batteries for initially supplying power for charging to the capacitor, based on a result of acquiring a voltage of each of the batteries; and perform voltage equalization among the plurality of batteries, in response to power for charging being supplied to the capacitor from the determined one or more batteries, wherein:

the one or more batteries for initially supplying power for charging to the capacitor are a group of batteries whose voltages are higher than a voltage of a remaining battery, among the plurality of batteries; and the one or more processors cause the battery control apparatus to:

supply power for charging to the capacitor from the group of batteries whose voltages are higher than the voltage of the remaining battery, through respective precharge resistors;

while power for charging is being supplied to the capacitor from the group of batteries, continue supplying power for charging to the capacitor also from the remaining battery whose voltage difference relative to the group of batteries whose voltages have dropped has become zero, through a precharge resistor; and connect the capacitor in parallel with the plurality of batteries by shorting the precharge resistors when voltage differences between a voltage of the capacitor and the voltages of the plurality of batteries have become a prescribed voltage difference.

4. The battery control apparatus for the power supply system according to claim 2, wherein:

the one or more batteries for initially supplying power for charging to the capacitor are a group of batteries whose voltages are higher than a voltage of a remaining battery, among the plurality of batteries; and the one or more processors cause the battery control apparatus to:

supply power for charging to the capacitor from the group of batteries whose voltages are higher than the voltage of the remaining battery, through respective precharge resistors, and perform voltage equalization of the batteries by supplying power for charging to the remaining battery whose voltage is lower than the voltages of the group of batteries, through the respective precharge resistors.

5. The battery control apparatus for the power supply system according to claim 2, wherein:

there are at least two batteries that have a voltage level difference; and when power for charging is to be supplied to the capacitor, the one or more processors cause the battery control apparatus to:

first supply power for charging to the capacitor from one battery, of the at least two batteries, that has a higher voltage, through a precharge resistor;

while power for charging is being supplied to the capacitor from the one battery that has the higher voltage, when a voltage difference between a voltage of the one battery that has the higher voltage whose voltage has dropped and a voltage of another battery that has a lower voltage has become zero, supply power for charging to the capacitor from the at least two batteries through respective precharge resistors; and when voltage differences between a voltage of the capacitor and the voltages of the at least two batteries have become less than or equal to a prescribed voltage difference, connect the capacitor in parallel to the at least two batteries by shorting the respective precharge resistors.

6. The battery control apparatus for the power supply system according to claim 1, wherein:

when power for charging is to be supplied to the capacitor, the one or more processors cause the battery control apparatus to:

first perform battery voltage equalization on a battery having a second highest voltage from a battery having a highest voltage, through a precharge resistor, and supply power for charging to the capacitor from the battery having the highest voltage and the battery having the second highest voltage, through precharge resistors;

next perform battery voltage equalization on a battery having a third highest voltage from the battery having the highest voltage and the battery having the second highest voltage, through the precharge resistors, and supply power for charging to the capacitor from the battery having the highest voltage, the battery having the second highest voltage, and the battery having the third highest voltage, through the precharge resistors; and subsequently continue to perform battery voltage equalization on other batteries similarly.

7. The battery control apparatus for the power supply system according to claim 2, wherein:

the load is a rotary electric machine that is driven through an inverter.

\* \* \* \* \*

UNITED STATES PATENT AND TRADEMARK OFFICE
CERTIFICATE OF CORRECTION

PATENT NO. : 11,799,315 B2
APPLICATION NO. : 17/697010
DATED : October 24, 2023
INVENTOR(S) : Ishihara et al.

It is certified that error appears in the above-identified patent and that said Letters Patent is hereby corrected as shown below:

In the Claims

At Line 21, in Column 18, in Claim 4:
It should read "The battery control apparatus for the power supply system according to claim 1,"

At Line 17, in Column 19, in Claim 7:
It should read "The battery control apparatus for the power supply system according to claim 1,"

Signed and Sealed this
Twenty-sixth Day of December, 2023

Katherine Kelly Vidal
*Director of the United States Patent and Trademark Office*